United States Patent [19]
Ausschnitt

[11] Patent Number: 5,731,877
[45] Date of Patent: Mar. 24, 1998

[54] AUTOMATED SYSTEM UTILIZING SELF-LABELED TARGET BY PITCH ENCODING

[75] Inventor: Christopher Perry Ausschnitt, Brookfield, Conn.

[73] Assignee: International Business Machines Corporation, Armonk, N.Y.

[21] Appl. No.: 727,138

[22] Filed: Oct. 8, 1996

[51] Int. Cl.⁶ .......................... G01B 11/14; G01B 11/00
[52] U.S. Cl. .......................... 356/375; 356/401
[58] Field of Search .......................... 356/399–401, 356/373, 375; 250/548

[56] References Cited

U.S. PATENT DOCUMENTS

| | | |
|---|---|---|
| 3,689,162 | 9/1972 | Ferguson ........................... 356/373 |
| 4,555,798 | 11/1985 | Broadbent, Jr. et al. . |
| 4,596,037 | 6/1986 | Bouchard et al. . |
| 4,783,826 | 11/1988 | Koso . |
| 4,853,967 | 8/1989 | Mandeville . |
| 4,893,346 | 1/1990 | Bishop . |
| 4,908,871 | 3/1990 | Hara et al. . |
| 4,981,372 | 1/1991 | Morimoto et al. . |
| 5,119,436 | 6/1992 | Holdgrafer . |
| 5,272,763 | 12/1993 | Maruyama et al. . |
| 5,386,294 | 1/1995 | Otatake et al. ........................... 356/401 |
| 5,418,613 | 5/1995 | Matsutani ........................... 356/401 |
| 5,483,345 | 1/1996 | Donaher et al. ........................... 356/401 |

*Primary Examiner*—Frank G. Font
*Assistant Examiner*—Amanda Merlino
*Attorney, Agent, or Firm*—DeLio & Peterson, LLC; Peter W. Peterson; H. Daniel Schnurmann

[57] ABSTRACT

An automated system utilizes self-labeled targets to locate and identify specific targets. Lithographic targets used for alignment, measurement and/or testing of features on a semiconductor substrate are assigned a unique pitch to identify the target. The targets have a plurality of elements with at least three edges distinguishable by an optical metrology tool. An invariant and unique process characteristic is defined by distances between elements or three or more edges, which is the pitch of the target. An optical metrology tool having a microprocessor and memory resolves the target elements, measures the distance between elements or edges, calculates the target pitch, compares it to the target pitch in memory, and determines whether the actual target pitch equals the stored target pitch to identify the target on the substrate.

16 Claims, 2 Drawing Sheets

AUTOMATED SYSTEM UTILIZING SELF-LABELED TARGET BY PITCH ENCODING

BACKGROUND OF THE INVENTION

1. Field of the Invention

The present invention relates generally to manufacturing processes requiring lithography and, more particularly, to a process for identifying target on a substrate formed by lithographic processes for the purposes of alignment, measurement and/or testing of the substrate and features thereon.

2. Description of Related Art

Lithography is used in manufacturing of semiconductors, flat panel displays, micromachines, disk heads and other industrial applications. The lithographic process uses a mask or reticule pattern which is transferred to photoresist film on a substrate by spacially modulated light, creating a latent image in the photoresist in some photoresist systems the latent image is formed directly by the photoactive component. In others, (so-called acid catalyzed photoresist), the photochemical interaction first generates acids which react with other photoresist components during a post exposure baked to form the latent image. In either case, the latent image marks the volume of photoresist material that either is removed during the development process (in the case of positive photoresist) or remains after development (in the case of negative photoresist) to create a three dimensional pattern in the photoresist film. This pattern is used as a template for subsequent etch and/or implant processes. Because of variations in exposure, focus, etch and location, patterns developed by lithographic processes must be continually monitored or measured to determine if the dimensions and location of the pattern are within acceptable range.

In determining the quality of lithographically created features on a substrate, critical dimension, alignment and overlay error may be measured, along with other parameters. For example, overlay error is measured to describe the accuracy of location of a pattern overlay when depositing successive layers on a substrate.

Targets used to determine critical dimension and overlay error have been disclosed in the prior art, most recently in U.S. application Serial Nos. 08/560,720, 08/560,851 and 08/643,138. The disclosures of these applications are hereby incorporated by reference. Such targets may be close packed on a substrate in order to conserve real estate on the substrate. At present, alignment and metrology target acquisition errors, whether tool or operator induced, are chronic and difficult-to-diagnosis sources of rework and scrap. Since the current solution is limited to the use of human readable labels, precise machine positioning and/or the reliance on pattern recognition algorithm. None of these approaches guarantee that the correct targets are used, or enable documentation of which target is actually used.

In the manufacture of semiconductor wafers into integrated circuit chips, factory automation requires machine readable targets, test structures and/or product features. The need for these machine readable targets is for alignment, measuring and testing of the lithographically created features and structures. Because of the many layers which may comprise a chip and the numerous measurements and tests performed on each layer, there is typically a need for a considerable number of targets and/or test structures. The size of these structures must be very small to have meaning, typically on the same order of magnitude as the desired product features. In today's semiconductor processes, this is on the order of a few microns or less. Pattern features themselves can have dimensions on the order of less than one micron down to 0.1 micron in current leading semiconductor technology. Manufacturing flexibility requires that accurate locations of different targets be accessed, depending on the product or type product being manufactured.

In order for automated machinery such as optical metrology tools to resolve small features, the window in which the machinery "sees" the target or structure must be correspondingly small. To this end, the automated machinery proceeds to send the window to a predetermined location to hunt, seek and lock in on the correct structure for processing. When the expected structure is not found, the automated machinery will increase the range of its search until the structure is found. Unfortunately, there is a need for many adjacent structures, and many of these structures are quite similar in nature such that previous methods of pattern recognition, which must allow for process variation, cannot distinguish among them. Where the adjacent structures are similar or the desired structure is absent or obscured because of misprocessing, the hunt-and-seek routines can mistakenly satisfy the machine with an adjacent, but incorrect, structure. Additionally, these hunt-and-seek routines are slow to determine the correct structure.

Given the presence of multiple targets and features on substrates, there is therefore a need to guarantee that the correct target or set of targets is used by the automated machinery throughout the manufacturing process. There is also the need to verify from the data collected by the automated machinery which target was used.

Bearing in mind the problems and deficiencies of the prior art, it is therefore an object of the present invention to provide a process and system for encoding lithographically created targets and structures on a substrate whereby selected targets may be accessed for measurement and testing.

It is another object of the present invention to provide a process and system for locating desired targets and structures by optical methods on a substrate.

A further object of the invention is to provide unique, optically readable codes for lithographically created targets and structures on a substrate, which codes are determined by the target or structure features.

It is yet another object of the present invention to provide a method and system for optically locating a selected target or structure out of a plurality of such structures on a substrate.

Still other objects and advantages of the invention will in part be obvious and will in part be apparent from the specification.

SUMMARY OF THE INVENTION

The above and other objects, which will be apparent to one skilled in the art, are achieved in the present invention which relates to a process for identifying targets on a substrate formed by a lithographic process which initially comprises providing a substrate having at least one target thereon for measurement of a parameter of the substrate, the target having a plurality of elements with at least three edges on and distinguishable from the substrate. Each of the elements are a desired distance from the other of the elements. The distance between the centerlines of the two of the elements or between two of the edges is the pitch of the target. The pitch is an intrinsic characteristic of the target that does not significantly vary with process conditions being monitored by the target. Thus, the pitch can be assigned a target value that is unique and invariant without affecting the performance of the target.

The process includes the steps of resolving the elements of the target with an optical metrology tool sufficient to measure the distances between the elements and measuring the distances between the elements. A mathematical value is then calculated based on the distances between the elements to determine an actual target pitch. Subsequently, the actual target pitch is compared to a stored target pitch and it is then determined whether the actual target pitch equals the stored target pitch to identify the target on the substrate.

Where the actual target pitch equals the stored target pitch, the process further includes the step of measuring a desired parameter of the substrate, such as critical dimension, alignment or overlay error, with the target. Where the actual target pitch does not equal the stored target pitch, the process further includes the steps of locating another target; measuring the actual target pitch of the other target; comparing the actual target pitch of the other target to a stored target pitch; and determining whether the actual target pitch of the other target equals the stored target pitch.

In a preferred embodiment, the target edges are straight edges aligned perpendicularly to a line crossing the at least three edges. At least two of the edges are opposite edges of a target element and a third edge is spaced apart from the target element. The actual target pitch may be determined by the value of the distance between edges on a first element of the target and the distance between the first element and a second element on the target. Alternatively, the target pitch equals the distance between a centerline of a first element of the target and a centerline of a second element on the target.

In another aspect, the present invention provides a system for identifying targets on a substrate formed by a lithographic process which comprises a substrate having at least one target thereon for measurement of a parameter of the substrate, the target having a plurality of elements with at least three edges on and distinguishable from the substrate. Each of the elements are a desired distance from the other of the elements, and the distances between the elements forms a target pitch. The system also includes an optical metrology tool capable of resolving the elements of the target to (i) measure the distances between the elements, (ii) calculate a mathematical value based on the distances between the elements to determine an actual target pitch, (iii) compare the actual target pitch to a stored target pitch, and (iv) determine whether the actual target pitch equals the stored target pitch to identify the target on the substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
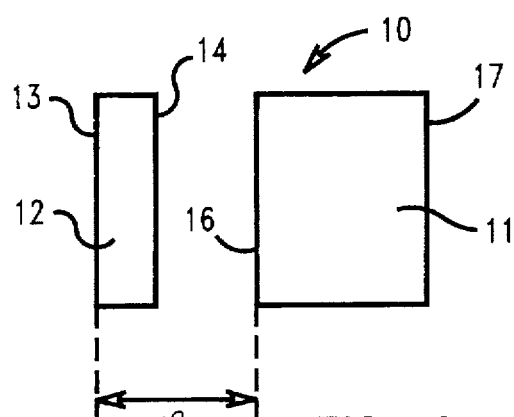
FIG. 1 is a top plan view of one embodiment of a self-encoded critical dimension target in accordance with the present invention.

In describing the preferred embodiment of the present invention, reference will be made herein to FIGS. 1–7 of the drawings in which like numerals refer to like features of the invention. Features of the invention are not necessarily shown to scale in the drawings.

The method of the present invention is accomplished using automated machinery, such as an optical metrology or alignment tool linked to a microprocessor and memory, whose primary task is reading of targets, test structures and/or product features to determine proper alignment, measurement and testing of structure parameters. These parameters include alignment, overlay error and critical dimension. The present invention provides a self-labeled target by encoding distances between actual target features, such as target edges, to determine the target "pitch" to provide a unique measurement or code for each target.

For any structure having a plurality of elements with three (3) or more edges distinguishable by the optical metrology tool from the substrate surface, a unique value of distance between those elements (e.g., centerlines or edges of the elements) may be defined to provide a unique signature which may be established for each such target, structure or product feature. An invariant process characteristic (pitch) of the target may be established by measuring distances between three or more edges on a target, and then adding those distance values to create a single number, or, alternatively, directly measuring the distance between the centerlines of two elements of a target. For example, the sum of the width of a pattern element (the distance between two opposite edges of a feature) and the distance of the closest pattern edge from an adjacent, third edge of another feature may be determined. This value of distances between centerlines of a pair of elements or three or more edges of the elements is the "pitch" of that feature which may be read by an optical metrology tool to determine what particular structure is being read. The next structure could comprise the same element width, but with a different space or distance to the next element edge. A different spacing value to a similar element width still yields a unique pitch and, therefore, a unique signature which may be read and retained with any subsequent data that is measured. Similarly, the space between elements may be held static while the width of the elements in any structure is varied. Both space and width may be varied as well. What is important is that each structure has a unique arrangement which is readily discernible to the optical metrology tool.

The pitch may be measured by automated machinery with good precision. Therefore a unique pitch may be assigned to each target or set of targets such that an automated metrology tool can identify a specific target by performing a pitch measurement from the centerlines or edges of the target elements. The pitch read by the tool can be compared to the design pitch stored in the tool's memory to determine whether or not the correct target has been located.

Furthermore, the tools measurement of pitch provides an unambiguous record of which target was used. As used herein, the term "target" includes any conventional target or other substrate feature or structure which has three or more edges which may be distinguished from the substrate surface.

A typical target for use in measuring critical dimension and alignment is made up of a plurality of elements each of which has a width w as measured between two, usually opposite, edges. The spacing between edges (usually closest edges) of each of the elements also has a distance d. By measuring the width of any particular element and its spacing to adjacent element, a total w+d can be determined. The value w+d is then the pitch of the target, which can be measured by an optical metrology tool.

A pair of separate targets may be adjacent each other on a substrate. In connection with the process of the present invention, an optical metrology tool, linked to a microprocessor suitable for detecting and measuring the distances between edges on the targets, may then come initially to a first of the targets. The optical metrology tool would then read the sum of the width of first target to the distance of the first target to the second target to be a value, for example x. The system would then compare the pitch x of the first target to the pitch of the target stored in the system memory to determine if the first target is the desired target to be located and evaluated on the substrate. If the first target has the target pitch stored in the memory, then the first target parameters and/or location can be established. If the first target does not have the pitch or unique signature of the desired target, the metrology tool would then widen the search parameters until it locates, for example, the second target adjacent to the first target. The optical metrology tool would then read the second target pitch y (different from pitch x of the first target) to establish the signature of that target. Assuming that this second target meets the parameters or unique pitch of the target in memory, then the search would stop there and the necessary measurements would be taken. If this second target also did not match the pitch in the system memory, then the search would continue until the correct target is located.

Turning now to FIG. 1, there is shown a critical dimension target 10 comprising spaced parallel rectangular elements 11 and 12. Element 11 has opposing side edges 16 and 17 while element 12 has opposing side edges 13 and 14. In connection with the process of the present invention, only 3 of the edges are required to determine a unique target pitch or value, namely edges 13, 14 and 16. Element 11 is considerably wider than element 12 and, because element edges can be used to determine target pitch, edge 17 is not necessary. The target pitch is the value p, determined by the sum of the distance between edges 13 and 14 of element 12 and the distance between edge 14 and edge 16 of element 11.

Figure 2:
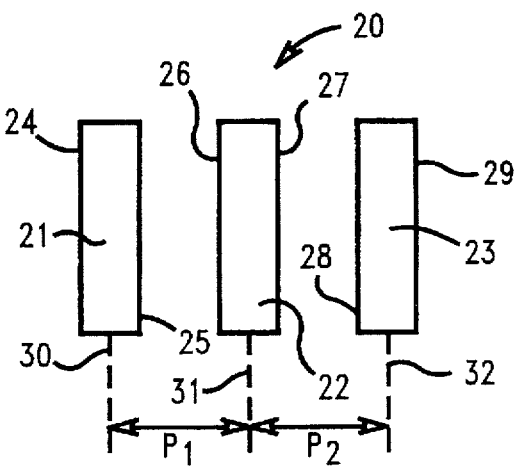
FIG. 2 is a top plan view of another embodiment of a self-encoded critical dimension target in accordance with the present invention.

In FIG. 2 there is shown another critical dimension target 20 comprising three spaced, parallel rectangular elements 21, 22 and 23. Element 21 has opposing side edges 24 and 25, element 22 has opposing side edges 26 and 27 and element 23 has opposing side edges 28 and 29. In this target 20, a unique target pitch may be determined by the centerlines of the individual elements, 30, 31 and 32. There is a distance $p_1$ between the centerlines of elements 21 and 22 and another distance $p_2$ between the centerlines of elements 22 and 23. The unique target pitch or value can be either of the individual centerline distances $p_1$ and $p_2$ or the sum of $p_1$ plus $p_2$.

Figure 3:
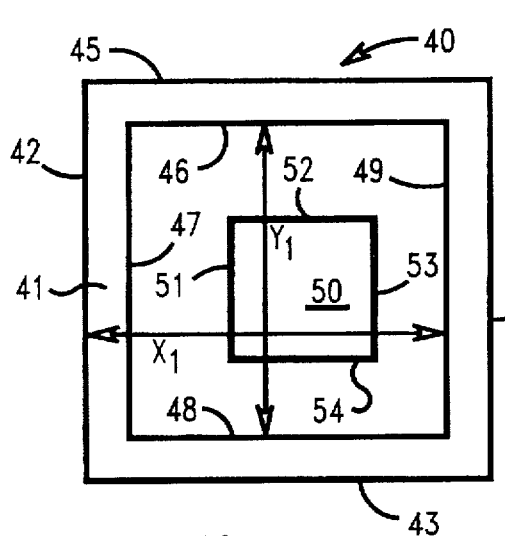
FIG. 3 is a top plan view of one embodiment of a self-encoded overlay target in accordance with the present invention.

In FIG. 3 there is shown a box-in-frame overlay target 40 comprising a center square element 50 surrounded by a spaced peripheral box element 41. Element 50 has peripheral edges 51, 52, 53 and 54 while element 41 has outer peripheral edges 42, 43, 44 and 45. Overlay target 40 may be used to determine the accuracy of overlay of element 50 on one substrate layer as compared element 41 on another substrate layer (either above or below element 50 layer) by comparing the centers of elements 41 and 50. A unique target pitch may be assigned to the outer frame of overlay target 40 by either one or both of distance $x_1$ (between edge 42 and edges 49), or $y_1$ (the distance between edge 43 and 46). Alternatively, the target pitch may be determined by the distances between the centerlines of opposite sides of frame 40 in the x and y directions.

Figure 4:
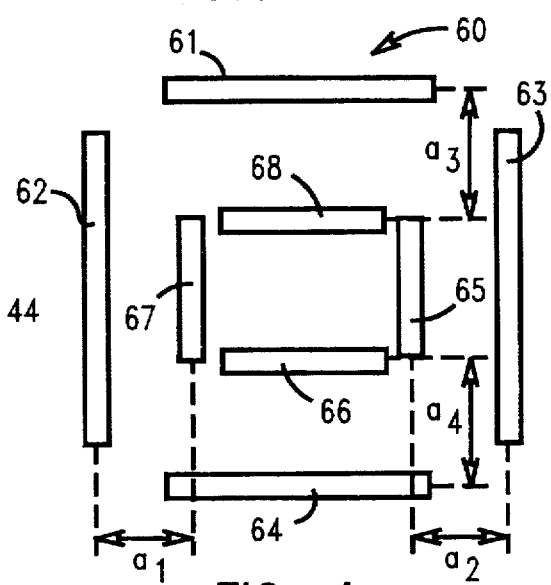
FIG. 4 is a top plan view of another embodiment of a self-encoded overlay target in accordance with the present invention.

A variation on the box-in-frame overlay target is shown in FIG. 4 utilizing bar-in-bar overlay target 60. Central elements 65, 66, 67 and 68 are arrayed in generally a square configuration on one layer of a substrate while outer rectangular elements 61, 62, 63, and 64 are arrayed in a generally square configuration on another (upper or lower) substrate level. As before, overlay target 60 may be used to determine the accuracy of location of one substrate layer with respect to another substrate layer. A unique target pitch may be established for overlay 60, for example, by determining the distances between the centerlines of the various target elements. For example, the centerline distance $a_1$ between elements 62 and 67 and the centerline distance $a_2$ between elements 65 and 63 may be added to determine the target pitch in the x-direction. Likewise, the target pitch in the y-direction may be determined by the sum of distance of $a_3$ (between the centerlines of elements 61 and 68) and the distance $a_4$ (the distance between a centerlines of elements 64 and 66). In this manner the target label can be encoded in either or both of the inner and outer bar structures.

Figure 5:
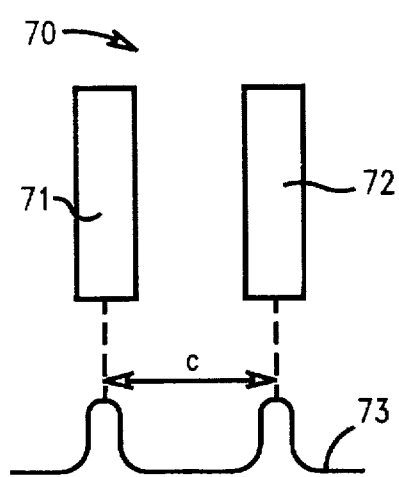
FIG. 5 is a top plan view of one embodiment of a self-encoded alignment target in accordance with the present invention.
Figure 6:
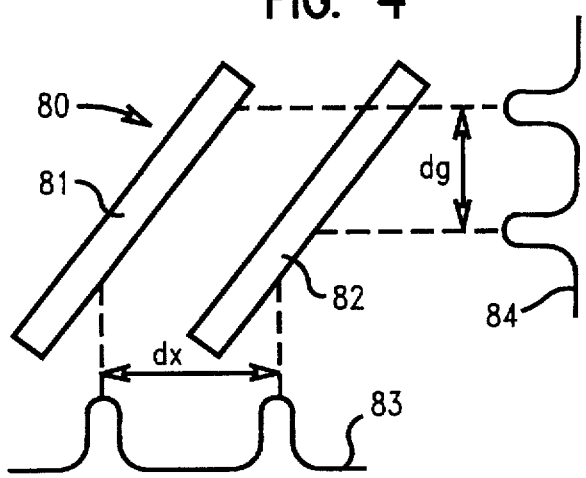
FIG. 6 is a top plan view of another embodiment of a self-encoded alignment target in accordance with the present invention.

Alignment targets 70 and 80 are shown in FIGS. 5 and 6, respectively. These alignment targets are used on exposure tool to determine where to expose a particular pattern. In alignment target 70, comprising parallel rectangular elements 71 and 72, there is a distance c between the elements which is determined by measuring the intensities of the element widths along a typical optical scan line 73 perpendicular to the element lengths. In FIG. 6 there is shown oblique alignment elements 81 and 82 which may be scanned in the x- and y-directions to determine a unique x-direction element distance $d_x$ and unique y-direction element direction $d_y$ by the peaks of scan lines 83 and 84, respectfully.

In general, overlay and alignment targets will have pitch values which may be determined by measurement between the edges or centers of individual elements. For critical dimension targets, it is preferable to measure distances between element edges although centerline measurements may also be made.

The amount of difference in target pitch values is determined by the precision with which the elements, edges and centerlines can be detected. For example, where the accuracy of the system is on the order of ±10 nanometers (3σ), the pitch of individual targets may be varied in greater than 10 nanometer increments (e.g., 20–50 nanometers) to create unique target pitch values. The increment that is selected may also be limited by the design grid size, which is typically 25 nanometers for current designs. These increments are small relative to overall target dimensions, and (i) allow many pitch increments for multiple targets, and (ii) allow targets to look identical for pattern recognition.

Figure 7:
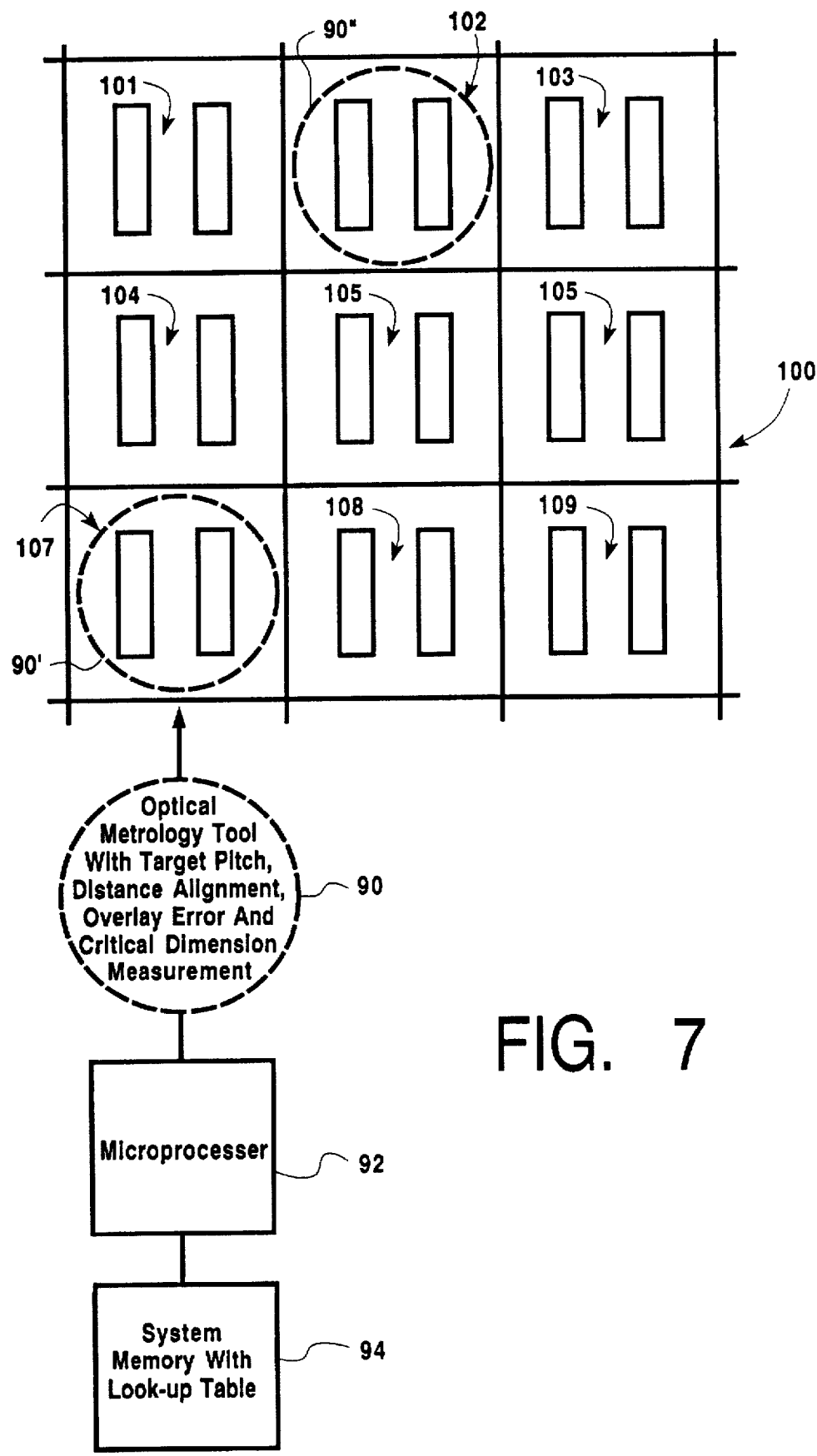
FIG. 7 is a top plan view of an automated optical metrology alignment system in use with a grid array of alignment targets in accordance with the present invention.

In FIG. 7 there is depicted operation of an automated optical metrology tool in connection with location of a desired self-encoded target among a plurality of such targets in accordance with the process of the present invention. Optical metrology tool includes a Biorad Optical Metrology System 90 operatively linked to a microprocessor 92 which is operatively linked to system memory 94. Beneath the tool is substrate 100 on which there are deposited a plurality of metrology targets 101-109 arrayed in a grid pattern, each of which has a unique spacing between the centerlines of the individual elements. These individual metrology targets 101-109 are each similar to alignment target 70 depicted in FIG. 5. Memory 94 contains a map of grid locations corresponding to each pitch of the individual targets 101-109, for example, in a look-up table. The system memory also has stored in it the particular pitch for the target it is trying to locate. For example, memory 94 may have stored in it the pitch for target 102.

When initializing the search, only a coarse alignment and pattern recognition step is required to locate any one target in the array, for example, initially the tool may be located at location 90' over target 107. The tool measures the pitch of target 107, i.e. the distance between the centerlines of the target elements, and from the pitch determined by processor 92 compares it to pitch stored in memory 94. Since the unique pitch will then be matched with that for the prestored location of element target 107, the tool determines from the look-up table that it must move to location depicted as 90" to locate the desired target 102. A measurement is then taken at location 90", and the measured pitch of target 102 is compared to the stored pitch of target 102 in system memory whereupon the tool confirms that it has found the correct target. At this point, any substrate parameter can be determined, for example, the desired dimension of a particular feature.

Thus, the present invention permits automated machinery to search multiple targets and features on substrates and locate and confirm the identity of a desired target on that substrate. Once this desired target is located then the proper parameters can be measured, for example, alignment, overlay error and/or critical dimension. The system of the present invention permits maximum manufacturing flexibility while still insuring the accurate location of different targets depending on the type of product being manufactured.

The applications for the present invention are widespread. In the specific case of lithographically created features, it could be used to guarantee correct alignment and overlay metrology trees amongst semiconductor product levels, and the utilization of correct critical dimension metrology structures. The present invention utilizes targets which incorporate a unique, machine readable identification tag or pitch and may be used by any manufacture utilizing automatic alignment metrology in its manufacturing process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process for identifying a desired target from multiple targets on a substrate formed by a lithographic process comprising providing a substrate having a target thereon for measurement of a parameter of said substrate, said target having a plurality of elements with at least three edges on and distinguishable from said substrate, each of said elements being a desired distance from the other of said elements, the distances between said elements forming a target pitch; resolving the elements of said target with an optical metrology tool sufficient to measure the distances between said elements; measuring the distances between said elements; calculating a mathematical value based on the distances between said elements to determine an actual target pitch; comparing the actual target pitch to a stored target pitch; and determining whether the actual target pitch equals the stored target pitch to identify the target on said substrate.

2. The process of claim 1 wherein the actual target pitch equals the stored target pitch and further including the step of measuring a desired parameter of said substrate with said target.

3. The process of claim 1 wherein the actual target pitch does not equal the stored target pitch and further including the steps of locating a second target having a plurality of elements with at least three edges on and distinguishable from said substrate, each of said second target elements being a desired distance from the other of said second target elements, the distances between said second target elements forming a second target pitch; measuring the actual target pitch of the second target; comparing the actual target pitch of the second target to a stored target pitch; and determining whether the actual target pitch of the second target equals the stored target pitch.

4. The process of claim 1 wherein said target elements are straight edges aligned perpendicularly to a line crossing said at least three edges.

5. The process of claim 1 wherein at least two of said edges are opposite edges of a target element and a third edge is spaced apart from said target element.

6. The process of claim 1 wherein the actual target pitch equals the sum of the distance between edges on a first element of said target and the distance between the first element and a second element on said target.

7. The process of claim 1 wherein the actual target pitch equals the distance between a centerline of a first element of said target and a centerline of a second element on said target.

8. The process of claim 1 wherein said actual target pitch is stored in a look-up table containing target pitches and locations of targets corresponding to the target pitches and further including the step of locating a target corresponding to said stored target pitch from said look-up table.

9. A system for identifying a desired target from multiple targets on a substrate formed by a lithographic process comprising a substrate having a target thereon for measurement of a parameter of said substrate, said target having a plurality of elements with at least three edges on and distinguishable from said substrate, each of said elements being a desired distance from the other of said elements, the distances between said elements forming a target pitch and an optical metrology tool having means for resolving the elements of said target to measure the distances between said elements, measuring the distances between said elements, calculating a mathematical value based on the distances between said elements to determine an actual target pitch, comparing the actual target pitch to a stored target pitch, and determining whether the actual target pitch equals the stored target pitch to identify the target on said substrate.

10. The system of claim 9 wherein said optical metrology tool includes means for measuring a desired parameter of said substrate with said target.

11. The system of claim 9 wherein said optical metrology tool includes means for locating a second target having a plurality of elements with at least three edges on and distinguishable from said substrate, each of said second target elements being a desired distance from the other of said second target elements, the distances between said second target elements forming a second target pitch; measuring the actual target pitch of the second target; comparing the actual target pitch of the second target to a stored target pitch; and determining whether the actual target pitch of the second target equals the stored target pitch.

12. The system of claim 9 wherein said target elements are straight edges aligned perpendicularly to a line crossing said at least three edges.

13. The system of claim 9 wherein at least two of said edges are opposite edges of a target element and a third edge is spaced apart from said target element.

14. The system of claim 9 wherein the actual target pitch equals the sum of the distance between edges on a first element of said target and the distance between the first element and a second element on said target.

15. The system of claim 9 wherein the actual target pitch equals the distance between a centerline of a first element of said target and a centerline of a second element on said target.

16. The system of claim 9 wherein said optical metrology tool includes a look-up table containing target pitches and locations of targets corresponding to the target pitches and means for locating a target corresponding to said stored target pitch from said look-up table.

* * * * *